United States Patent
Bathan et al.

(10) Patent No.: US 8,207,600 B2
(45) Date of Patent: Jun. 26, 2012

(54) INTEGRATED CIRCUIT PACKAGE SYSTEM WITH ENCAPSULATING FEATURES

(75) Inventors: Henry Descalzo Bathan, Singapore (SG); Jeffrey D. Punzalan, Singapore (SA); Abelardo Hadap Advincula, Singapore (SG); Jose Alvin Caparas, Singapore (SG)

(73) Assignee: Stats Chippac Ltd., Singapore (SG)

( * ) Notice: Subject to any disclaimer, the term of this patent is extended or adjusted under 35 U.S.C. 154(b) by 377 days.

(21) Appl. No.: 11/694,921

(22) Filed: Mar. 30, 2007

(65) Prior Publication Data

US 2008/0237816 A1   Oct. 2, 2008

(51) Int. Cl.
*H01L 23/495* (2006.01)

(52) U.S. Cl. ......... 257/670; 257/787; 438/123; 438/112

(58) Field of Classification Search .......... 257/666–787, 257/E23.031, E23.042, 678; 438/106, 123
See application file for complete search history.

(56) References Cited

U.S. PATENT DOCUMENTS

| | | | |
|---|---|---|---|
| 5,391,439 A | 2/1995 | Tomita et al. | |
| 5,429,992 A * | 7/1995 | Abbott et al. | 29/827 |
| 6,242,281 B1 * | 6/2001 | Mclellan et al. | 438/106 |
| 6,610,924 B1 | 8/2003 | Lee et al. | |
| 6,627,976 B1 * | 9/2003 | Chung et al. | 257/666 |
| 6,696,747 B1 | 2/2004 | Lee et al. | |
| 6,847,099 B1 | 1/2005 | Bancod et al. | |
| 7,060,536 B2 | 6/2006 | Punzalan et al. | |
| 7,084,003 B2 * | 8/2006 | Mazzola et al. | 438/106 |
| 2002/0041010 A1 * | 4/2002 | Shibata | 257/666 |
| 2002/0109242 A1 * | 8/2002 | Kasuga et al. | 257/787 |
| 2005/0051880 A1 * | 3/2005 | Lee et al. | 257/678 |
| 2005/0260787 A1 * | 11/2005 | Punzalan et al. | 438/106 |

* cited by examiner

*Primary Examiner* — Matthew E Warren
*Assistant Examiner* — Fang-Xing Jiang
(74) *Attorney, Agent, or Firm* — Ishimaru & Associates LLP; Mikio Ishimaru; Stanley Chang

(57) ABSTRACT

An integrated circuit package system is provided including forming a lead frame includes forming a mold gate, providing a first surface, and providing a second surface opposite the first surface; and forming angled gate sides facing each other in the mold gate between the first surface and the second surface.

20 Claims, 2 Drawing Sheets

INTEGRATED CIRCUIT PACKAGE SYSTEM WITH ENCAPSULATING FEATURES

TECHNICAL FIELD

The present invention relates generally to integrated circuit package system, and more particularly to integrated circuit package system with encapsulating features.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a lead frame whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat no-lead package ("QFN"). QFN packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with increased number of input/output (I/O) in high volume.

For example, dual row QFN packages are popular packages due to its high lead count capability. In order to have a higher lead count, we need to have fine lead pitch, e.g. 0.5 mm, and thinner lead frames. However, lead frame suppliers have lead frame thickness requirements for fine pitch design. Use of these thinner lead frames present challenges during molding that often results in incomplete fill problem stemming from the reduction in lead frame gate design.

Thus, a need still remains for an integrated circuit package system providing low cost manufacturing and improved yield for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a lead frame includes forming a mold gate, providing a first surface, and providing a second surface opposite the first surface; and forming angled gate sides facing each other in the mold gate between the first surface and the second surface.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
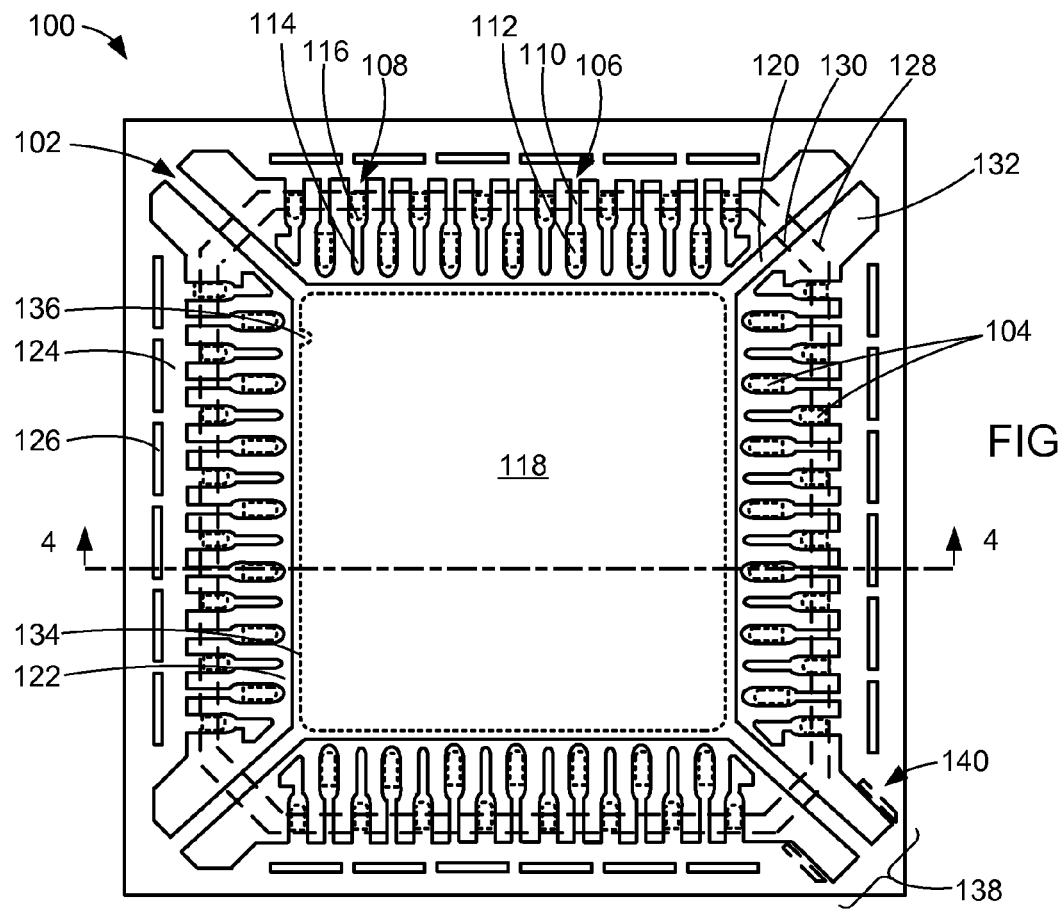
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The plan view depicts the integrated circuit package system 100 as unsingulated from a lead frame 102. The lead frame 102 has dual rows of external interconnects 104. An inner row of the external interconnects 104 has inner leads 106. An outer row of the external interconnects 104 has outer leads 108.

Each of the inner leads 106 has an inner lead tip 110 that may be formed by a number of processes, such as half etching. The formation of the inner lead tip 110 also forms an inner lead body 112. The inner lead body 112 is towards an interior of the integrated circuit package system 100 and the inner lead tip 110 is towards a periphery of the integrated circuit package system 100. The inner lead body 112 is wider than the inner lead tip 110.

Each of the outer leads 108 has an outer lead tip 114 that may be formed by a number of processes, such as half etching. The formation of the outer lead tip 114 also forms an outer lead body 116. The outer lead body 116 is towards a periphery of the integrated circuit package system 100 and the outer lead tip 114 is towards an interior of the integrated circuit package system 100. The outer lead body 116 is wider than the outer lead tip 114.

The inner leads 106 and the outer leads 108 are at alternating locations to one another. The dimensions of the inner leads 106 and the outer leads 108 are complementary. The inner lead tip 110 and the outer lead body 116 are adjacent to each other towards the periphery of the integrated circuit package system 100 without the inner leads 106 contacting the outer leads 108. The inner lead body 112 and the outer lead tip 114 are adjacent to each other towards the periphery of the integrated circuit package system 100 without the inner leads 106 contacting the outer leads 108. The complementary dimensions provide a higher density of the external interconnects 104 resulting in the increased pitch of the external interconnects 104.

The integrated circuit package system 100 also includes a paddle 118, such as a die-attach paddle. Tie bars 120 attach to corners of the paddle 118. Inner voids 122 are the space between the external interconnects 104, the paddle 118, and the tie bars 120. Dam bars 124 are between the inner voids 122 and outer voids 126. The dam bars 124 help prevent molding material from flowing over the external interconnects 104 upon encapsulating.

A singulation outline 128 depicted by the dotted line shows the singulation boundary of the lead frame 102. The dam bars 124, portions of the external interconnects 104, and portions of the tie bars 120 are removed upon singulation forming the integrated circuit package system 100. A mold outline 130 depicted by the dotted line within the singulation outline 128 shows the outline of an encapsulation 132, such as an epoxy mold compound, of the integrated circuit package system 100.

A paddle outline 134 depicted by a dotted line within the paddle 118 shows a bottom peripheral region of the paddle 118 that is half etched. A recess 136 in the paddle outline 134 may represent the pin 1 location of the integrated circuit package system 100.

As the pitch of the external interconnects 104 increases, the lead frame 102 used to manufacture the integrated circuit package system 100 gets thinner. Typically, the reduced thinness of the lead frame 102 reduces mold gates 138 along the tie bars 120. Reduction in the mold gates 138 may cause premature curing of the molding compound resulting in partial or incomplete fills or formation of the encapsulation 132.

Angled gate sides 140 are depicted as dashed trapezoids and part of the mold gates 138. The angled gate sides 140 increases the flow of the molding compound through the mold gates 138 thereby mitigating or eliminating incomplete formation of the encapsulation 132.

Figure 2:
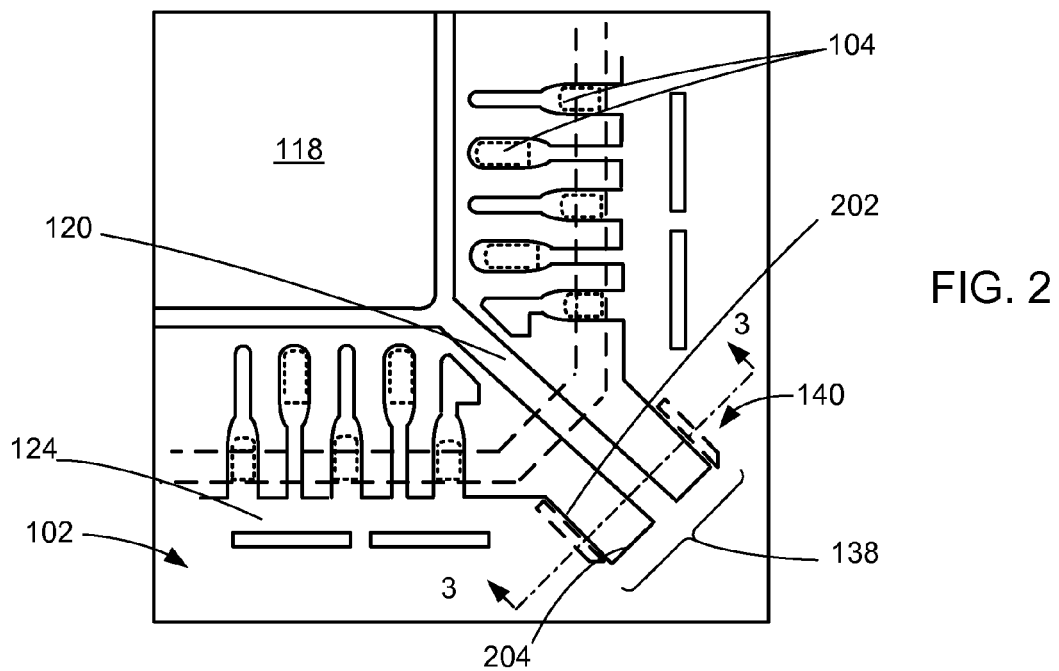
FIG. 2 is a more detailed plan view of one of the mold gates.

Referring now to FIG. 2, therein is shown a more detailed plan view of one of the mold gates 138. The more detailed cross-sectional view depicts one of the mold gates 138 at a corner of the integrated circuit package system 100 of FIG. 1 in the lead frame 102. The paddle 118 is in the interior to the external interconnects 104. The dam bars 124 are shown at the opposite sides of the external interconnects 104 to the paddle 118.

One of the tie bars 120 is shown connecting the paddle 118 with the other portion of the lead frame 102 which includes the mold gates 138. The angled gate sides 140 are shown as dashed trapezoids adjacent to first sides 202 of the mold gates 138 that are shown parallel to the tie bars 120. The angled gate sides 140 preferable extend to second sides 204 of the mold gates 138 where the tie bars 120 attach to the rest of the lead frame 102.

For illustrative purposes, the angled gate sides 140 are shown not extending to the inner voids 122, although it is understood that the angled gate sides 140 may extend to the inner voids 122. Also for illustrative purposes, the angled gate sides 140 are shown not extending past the second sides 204, although it is understood that the angled gate sides 140 may extend beyond the second sides 204. Further for illustrative purposes, the angled gate sides 140 are shown substantially parallel with the first sides 202 and the tie bars 120, although it is understood that the angled gate sides 140 may be in a different configuration, such as non-parallel configuration or a funnel configuration.

Figure 3:
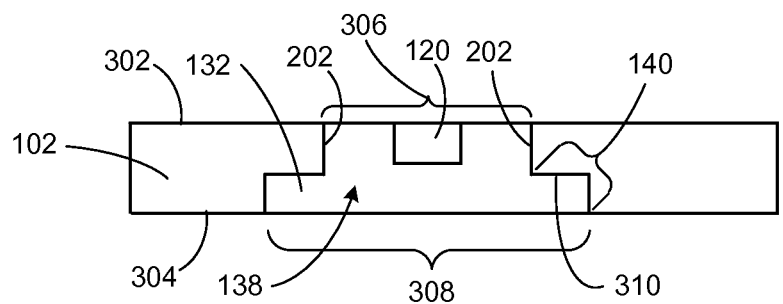
FIG. 3 is a cross-sectional view of the structure of FIG. 2 along line 3-3.

Referring now to FIG. 3, therein is shown a cross-sectional view of the structure of FIG. 2 along line 3-3. The cross-sectional view depicts one of the mold gates 138 having the first sides 202 and the angled gate sides 140 in a stepped configuration, wherein the angled gate sides 140 facing each other. The angled gate sides 140 having a vertical and horizontal portion is shown as one step to the first sides 202. One of the tie bars 120 is between the first sides 202.

The angled gate sides 140 may be formed in a number of different ways. For example, the angled gate sides 140 may be half-etched along with the tie bars 120. The angled gate sides 140 along with the space between the first sides 202 and the tie bars 120 provide additional surface area than without the angled gate sides 140.

As miniaturization of the integrated circuit package system 100 of FIG. 1 continues, the pitch of the external interconnects 104 of FIG. 1 will continue to decrease. The trend of continued miniaturization will also continue to decrease the thickness of the lead frame 102 thereby increasing the potential of incomplete fill or formation of the encapsulation 132. The angled gate sides 140 may be formed in different configurations as needed.

For example, the mold gates 138 may have the angled gate sides 140 in a sloped configuration between a first surface 302 of the mold gates 138 and a second surface 304 of the mold gates 138. Another example, the angled gate sides 140 may be in a configuration having multiple half-etched portions instead of the configuration with one half-etched portion providing a smaller increment of steps but generally sloped between the first surface 302 and the second surface 304. The cross-sectional view depicts the angled gate sides 140 with the first surface 302 having a first opening 306 and the second surface 304 having a second opening 308 wider or larger than the first opening. In at least one embodiment, each of the angled gate sides 140 can include a horizontal portion 310 facing the second opening 308.

Figure 4:
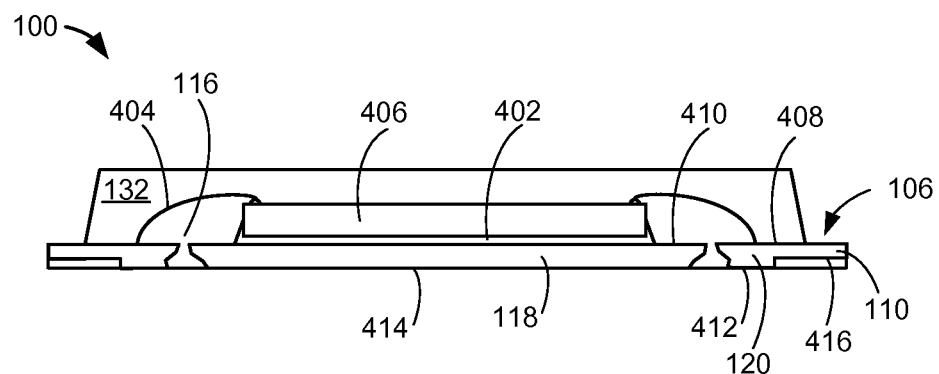
FIG. 4 is a cross-sectional view of the integrated circuit package system of FIG. 1 along line 4-4.

Referring now to FIG. 4, therein is shown a cross-sectional view of the integrated circuit package system 100 along a line 4-4 of FIG. 1. The cross-sectional view depicts the integrated circuit package system 100 singulated from the lead frame 102 of FIG. 1. The paddle 118 is shown between the inner leads 106. An integrated circuit die 406 mounts over the paddle 118 with an adhesive 402, such as a die-attach adhesive. Interconnects 404, such as bond wires, connect the integrated circuit die 406 and the inner leads 106.

For illustrative purposes, the integrated circuit package system 100 is shown with the integrated circuit die 406, although it is understood that the integrated circuit die 406 may represent another integrated circuit package system (not shown). Also for illustrative purposes, the integrated circuit package system 100 is shown with the integrated circuit die 406, although it is understood that the integrated circuit die 406 may represent a stack of integrated circuit dice (not shown).

The cross-sectional view depicts that an inner lead topside 408 of the inner leads 106 and a paddle topside 410 of the paddle 118 are coplanar. The cross-sectional view also depicts that an inner body bottom side 412 of the inner lead body 112 and a paddle bottom side 414 of the paddle 118 are coplanar. The inner lead tip 110 had an inner tip bottom side 416, wherein the inner tip bottom side 416 is above the inner body bottom side 412.

The encapsulation 132, such an epoxy mold compound, covers the integrated circuit die 406 and the interconnects 404. The encapsulation 132 also partially covers the inner leads 106 and the paddle 118 exposing the paddle bottom side 414 and the inner body bottom side 412.

Figure 5:
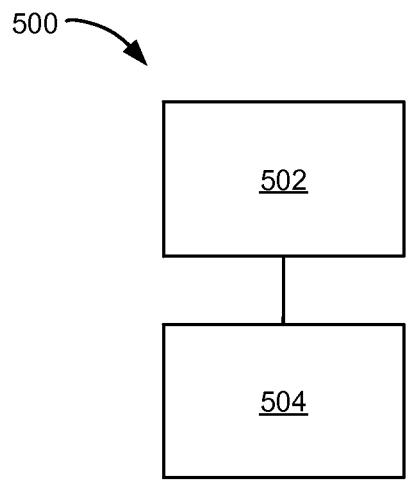
FIG. 5 is a flow chart of an integrated package system for manufacturing the integrated circuit package system in an embodiment of the present invention.

Referring now to FIG. 5, therein is shown a flow chart of an integrated circuit package system 500 for manufacturing the integrated circuit package system 100 in an embodiment of the present invention. The system 500 includes forming a lead frame includes forming a mold gate, providing a first surface, and providing a second surface opposite the first surface in a block 502; and forming angled gate sides facing each other in the mold gate between the first surface and the second surface in a block 504.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit package system comprising:
   forming a lead frame having a mold gate comprising:
   providing a first surface having a first opening, and
   providing a second surface having a second opening and opposite the first surface; and
   forming angled gate sides having the second opening larger than the first opening, the angled gate sides facing each other in the mold gate between the first surface and the second surface and with each of the angled gate sides including a horizontal portion facing the second opening.

2. The method as claimed in claim 1 wherein forming the lead frame includes forming a tie bar in the mold gate.

3. The method as claimed in claim 1 wherein forming the angled gate sides facing each other in the mold gate includes half-etching the lead frame from the second surface for forming the angled gate sides.

4. The method as claimed in claim 1 further comprising:
   connecting an integrated circuit die and the lead frame; and
   encapsulating the integrated circuit die through the mold gate.

5. The method as claimed in claim 1 wherein forming the lead frame includes forming an inner lead and an outer lead.

6. A method of manufacture of an integrated circuit package system comprising: forming a lead frame having a mold gate comprising:
   forming a tie bar in the mold gate,
   providing a first surface having a first opening, and
   providing a second surface having a second opening and opposite the first surface;
   connecting an integrated circuit die and the lead frame;
   forming angled gate sides having the second opening larger than the first opening, the angled gate sides facing each other in the mold gate between the first surface and the second surface and with each of the angled gate sides including a horizontal portion facing the second opening; and
   encapsulating the integrated circuit die through the mold gate.

7. The method as claimed in claim 6 further comprising singulating portions of the lead frame.

8. The method as claimed in claim 6 wherein forming the angled gate sides facing each other in the mold gate includes half-etching the lead frame from the second surface for forming the angled gate sides.

9. The method as claimed in claim 6 wherein forming the lead frame having the tie bar includes half-etching the tie bar.

10. The method as claimed in claim 6 wherein connecting the integrated circuit die and the lead frame includes connecting an external interconnect of the lead frame and the integrated circuit die.

11. An integrated circuit package system comprising: a lead frame having a mold gate comprising:
   a first surface having a first opening,
   a second surface having a second opening and opposite the first surface, and
   wherein: the mold gate having angled gate sides having the second opening larger than the first opening, the angled gate sides facing each other between the first surface and the second surface and with each of the angled gate sides including a horizontal portion facing the second opening.

12. The system as claimed in claim 11 wherein the lead frame includes a tie bar in the mold gate.

13. The system as claimed in claim 11 wherein the lead frame having the mold gate includes the angled gate sides in a stepped configuration from the second surface.

14. The system as claimed in claim 11 further comprising:
   an interconnect between an integrated circuit die and the lead frame; and
   an encapsulation over the integrated circuit die through the mold gate.

15. The system as claimed in claim 11 wherein the lead frame includes an inner lead and an outer lead.

16. The system as claimed in claim 11 wherein:
   the lead frame includes a tie bar in the mold gate; and
further comprising:
   an interconnect between an integrated circuit die and the lead frame; and
   an encapsulation over the integrated circuit die through the mold gate.

17. The system as claimed in claim 16 wherein the integrated circuit package system includes only portions of the lead frame within a singulation outline.

18. The system as claimed in claim 16 wherein the lead frame having the mold gate includes the angled gate sides in a stepped configuration.

19. The system as claimed in claim 16 wherein the lead frame having the tie bar includes the tie bar above the second surface.

20. The system as claimed in claim 16 further comprising an external interconnect of the lead frame connected with the integrated circuit die.

* * * * *